United States Patent Office 3,822,235

Patented July 2, 1974

3,822,235

METHOD OF PRODUCING LIGHTSENSITIVE EPOXY RESINS

Donald Noel Hunter, Great Bookham, and Peter William Mayor, Hounslow, England, assignors to U.S. Philips Corporation No Drawing. Filed Apr. 20, 1972, Ser. No. 245,783
Claims priority, application Great Britain, Apr. 30, 1971, 12,344/71
Int. Cl. C08g *30/04*
U.S. Cl. 260—47 EP 14 Claims

ABSTRACT OF THE DISCLOSURE

A light-sensitive polymer produced by reacting an epoxide resin with *p*-azidobenzoic acid or an esterifiable derivative thereof.

This invention relates to a method of preparing light-sensitive polymeric compounds and to compositions containing the same. In particular this invention relates to a method of preparing low molecular weight light-sensitive polymeric compounds by reacting an aromatic azide with an epoxide resin as hereinafter defined in the presence of a common solvent. Prior to the present invention photomechanical resist compositions which contained certain light-sensitive agents were used in the semiconductor industry for producion of photographic relief images on the surface of substrates by coating the surface of the substrate with the resist compositions, exposing at least one part of the coating to irradiated light, removing either the exposed or the unexposed part of the resist coating and treating the surface of the substrate (for example, by etching or electroplating) to produce an appropriate positive or negative replica of the exposed area on the surface of the substrate. However, these photomechanical resist compositions had certain disadvantages, such as a low resolution and poor edge definition of the projected image, pin-hole and other defects in the developed image, such as poor adhesion of the resist coating to the substrate which limited their use in various media and undue oxidation or instability of the resist. It was known from United Kingdom Patent Specification No. 767,985 that light-sensitive coating compositions comprising an organic-solvent-soluble colloid containing substantially no polar groupings such as natural or synthetic rubbers, sensitised with a water-insoluble aryl azide compound, can be used for photomechanical printing and reproduction purposes. Photomechanical images are described in this specification as being produced from such materials after exposure and removal of the unexposed parts by treatment with an organic solvent. It is also known from British Patent Specification No. 1,118,213 that light-sensitive compositions consisting of or including a soluble modified epoxy resin may be obtained by reacting a chlorosulphonyl- or chlorocarbonyl-substituted azidoaryl compound with an epoxy resin obtained by the polycondensation of a bisphenol with epichlorhydrin. These compositions are of the type which are formed by reacting the free hydroxyl groups of the epoxy resins (obtained by the polycondensation of bisphenol and epichlorhydrin) with the chlorosulphonyl- or chlorocarbonyl-substituted azidoaryl compound with the elimination of hydrogen chloride. The epoxide resins obtained by polycondensation of 2,2-bis(4-hydroxyphenyl)-propane with epichlorhydrin may have for example a molecular weight of about 30,000 prior to the reaction with the chlorosulphonyl- or chlorocarbonyl-substituted azidoaryl compound. Such compounds are therefore approximately 5000 A. ($5\times10^{-5}$ cm.) in length, with their light-reactive centres arranged along the length of the polymer chain in the positions of the former hydroxyl groups.

We have discovered that particularly satisfactory light-sensitive polymeric compounds may be prepared by reacting an aromatic azide with the epoxy groups of an epoxide resin of the type represented by the general formula I

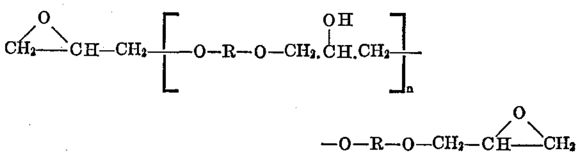

I in which formula R represents the hydrocarbon nucleus of a dihydric phenol or glycerol which is free from functional groups other than phenolic hydroxy groups such as *p,p'*-dihydroxydiphenyl, *p,p'*-dihydroxydiphenyl methane, *p,p'*-dihydroxydiphenylmethylmethane, *p,p'*-dihydroxydibenzyl, and *p,p'*-dihydroxydiphenyldimethyl methane or a 1,2-propylene oxide derivative thereof, and *n* is an integer of about 0 to 3.

We have also discovered that the light-resolution, and the edge definition, of a projected image can be improved by the use of light-sensitive polymeric materials which have a relatively short molecular length, especially if the light-sensitive centres are arranged as the terminal groups of such molecules.

According to the present invention there is provided a method of preparing low molecular weight light-sensitive polymeric compounds, which method comprises reacting, in the presence of a common solvent, *p*-azidobenzoic acid or an esterifiable derivative thereof with an epoxide resin as represented by Formula I, in which formula R and *n* are as hereinbefore defined. In one preferred embodiment the epoxide resin has a molecular weight between 340–1500.

In a particularly preferred embodiment the epoxide resin as represented by Formula I has a molecular weight between 340–750. It has been found that polymeric compounds prepared from epoxide resins as defined above wherein *n* is 0 are approximately 40 A. ($4\times10^{-7}$ cm.) long.

Preferably, two moles of *p*-azidobenzoic acid or an esterifiable derivative thereof are reacted with one mole of the epoxide resin monomer. In one embodiment the epoxide resin monomers are represented by Formula I wherein *n* is 0 or 1 with two terminal epoxy groups only. In another embodiment novolak epoxide resins with molecular weights in the range of 600–750 are especially suitable. Thus, the epoxide resin may be prepared by reacting from 2 to 4 moles of epichlorhydrin with one mole of bisphenol A under an inert atmosphere and with the gradual addition of 2 moles of sodium hydroxide. On completion of the reaction the epoxide product is separated therefrom and reacted with *p*-azidobenzoic acid or an esterifiable derivative thereof at a temperature of less than 150° C.

Alternatively, a novolak resin may be prepared by reacting one mole of phenol with 0.8 mole formaldehyde in the presence of an acid catalyst at 100° C. The product is separated (for example by removing the water) at the desired degree of polymerisation and reacted with epichlorhydrin to form the epoxide groups on the novolak resin nucleus. This product is separated and reacted with *p*-azidobenzoic acid or an esterifiable derivative thereof preferably in the mole ratio of one mole of novolak resin to 3–4 moles of *p*-azidobenzoic acid or derivative thereof.

The reaction may take place in a suitable reaction medium which provides a solvent common to *p*-azidobenzoic acid and to the epoxide resin monomer, for example, in an organic solvent, such as toluene or 1,4-dioxane. In the preparation of the novolak resin the phenol-formaldehyde ratio may be adjusted within fine limits to give the desired size of resin.

According to the present invention there are also provided novel light-sensitive polymeric compounds represented by the general formula II

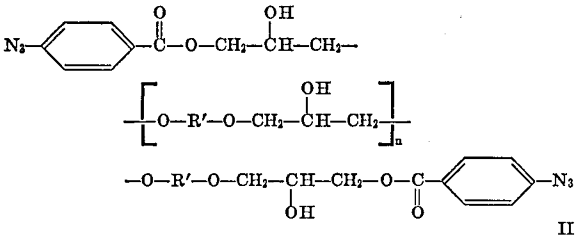
II in which formula R′ represents the hydrocarbon nucleus of a dihydric phenol or glycerol which is free from functional groups other than phenolic hydroxy groups or 1,2-propylene oxide and *p*-azidobenzoxy derivatives thereof, and *n* is an integer between 0 and 3.

It is understood that the polymeric compounds as represented by Formula II above may be converted, by exposure to light, to compounds with terminal or cross-linked radicals —N= and that such compounds are also within the scope of the present invention.

One particularly preferred polymeric compound represented by Formula II contains the hydrocarbon nucleus *p,p′*-dihydroxydiphenyldimethyl methane. Other particularly preferred compounds are wherein R is the hydrocarbon nucleus of *p,p′*-dihydroxydiphenyldimethyl methane and *n* is 0. The radical R′ of the polymers represented by Formula II preferably has a terminal *p*-azidobenzoxy group, especially when prior to reaction with *p*-azidobenzoic acid the appropriate epoxide resin is prepared from a novolak resin.

The present invention also provides light-sensitive polymeric compositions which contain the compounds when prepared according to the invention mixed with, dissolved or dispersed in an inert carrier, together with, if desired, other additives and/or light-sensitising agents.

Thus, one object of the invention is to provide photosensitive coatings which when coated on a substrate are suitable for use in the micro-electronics industry in which said coatings contain a compound prepared according to the invention.

Epoxide resins which are suitable for use in the preparation of compounds according to the invention may be chosen from the following resins:

(a) Epoxide resins of the type represented by Formula I when prepared by reacting together acetone and 2 mole equivalents of phenol to give bisphenol A

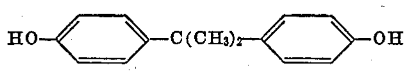

The bisphenol A is then reacted with epichlorhydrin

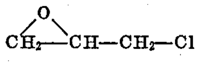

for example, in the proportions of 2 moles of epichlorhydrin to 1 mole of bisphenol A to give a diglycidyl ether. Preferably, excess epichlorhydrin is used, the amount of excess of epichlorhydrin determining the resultant molecular weight of the epoxide resin and therefore the resultant molecular weight of the polymeric compound;

(b) Epoxide resins when prepared in a similar way to (a) above but using, instead of bisphenol A, glycerol ($CH_2OH \cdot CHOH \cdot CH_2OH$), bisphenol F

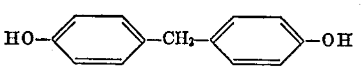

or a long chain bisphenol derived from cashew nut oil, for example

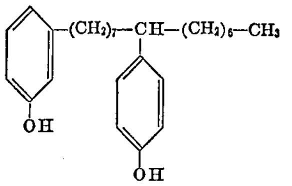

followed by epoxidation with epichlorhydrin; and (c) Epoxide resins when prepared from novolak resins are particularly suitable. Novolak resins may be epoxidise through their phenolic hydroxy groups. Particularly suitable novolak resins are formed by reacting phenol and formaldehyde in the molar ratio of 1:0.8 under acidic conditions to give dihydroxy diphenyl methane, for example, 2,2′-diphenolmethane, 2,4′-diphenolmethane or 4,4′-diphenolmethane or mixtures of these compounds. The preparation of epoxide resin monomers which are particularly suitable for use in the methods according to the invention will now be described in more detail.

Diglycidyl ether with a molecular weight of 340 was prepared as follows. 28 g. (1 mole) of bisphenol A was dissolved in 370 g. (4 moles) of epichlorhydrin and the mixture was heated to a temperature of between 105° C. and 110° C. under an atmosphere of nitrogen. 80 g. (2 moles) of caustic soda as a 30% aqueous solution was then added slowly in a dropwise manner whilst the mixture was continuously stirred for 16 hours, during which period the mixture was maintained alkaline to phenolphthalein indicator. An organic layer separated out which was dried with sodium sulphate and fractionally distilled under vacuum.

In an alternative preparation a diglycidyl ether of molecular weight of 451 was prepared from a mixture which contained epichlorhydrin and bisphenol A in the ratio of 2:1.

When the mole ratio of epichlorhydrin to bisphenol A was reduced to below 2:1 (e.g. 1.4, 1.33 and 1.25), diglycidyl ethers were produced with molecular weights greater than 790 and these, on combination with *p*-azidobenzoic acid, were subsequently found to be less satisfactory from the light-resolution point of view. Thus, the preferred molecular weight range for the diglycidyl ether prepared from bisphenol A is from 340 to 750 and the especially preferred molecular weight range is from 340 to 460, although high molecular weight resins, for example 1500 or over, give light-sensitive compounds with very good adhesive and film-forming properties.

Epoxide resins wherein *n* is 0 and R is a diphenyldimethyl methane radical are amber-coloured viscous liquids and may be readily combined with *p*-azidobenzoic acid or an esterifiable derivative thereof. Epoxide resins which contain more than two reactive epoxide groups per molecule are particularly suitable for the purpose of the present invention, especially if, for example, they are formed by cross-linkage of side-chain hydroxyl groups of two or more linear diepoxide monomers. It has been found that epoxide polyether monomers are suitable for use in the present invention, especially the lower molecular weight ethers, for example compounds of the above general Formula I, in which formula R is an aromatic nucleus, e.g. diphenolpropane and *n* is between 0 and 2 and is preferably 0.

The compounds according to the invention may be dissolved in organic solvents to form solutions. Suitable solvents for the compounds are, for example, ketones, such as cyclohexanone, methyl ethyl ketone, 1,4-dioxane; esters, such as ethyl acetate, butyl acetate, methyl glycoacetate; and mixtures of these and other solvents. The solvents may also be diluted with hydrocarbons, such as xylene and/or dipolar aprotic solvents such as dimethyl formamide, dimethyl acetamide and N-methyl pyrrolidone. As, in general, the solubility of the compounds of the invention decreases with increasing molecular weight, the lower molecular weight range of compounds of Formula II are especially preferred. Compositions comprising solutions of the compounds according to the invention in suitable organic solvents and/or diluents as hereinbefore described may be coated onto the surface of a substrate and allowed to dry. A water-insoluble, chemically-resistant layer is then formed which is sensitive to irradiated light in accordance with the number of light-reactive triazo groups and free nitrilo radicals present. On exposure of the coating to actinic light via a photographic mask, exposed and unexposed areas are produced in which the unexposed areas contain the soluble compound represented substantially by Formula II and the exposed areas contain the non-soluble cross-linked derivatives of the Formula II. The difference in solubilities between the two groups of compounds after exposure to light has been found to provide a means whereby the coating may be satisfactorily developed in an appropriate solvent to remove the resin from the light-exposed areas. Preferably, the example, the solvent selected to remove the non-exposed photo-sensitive polymeric material is the same solvent selected to form a solution of the material. Alternatively, if it is considered necessary to alter the rate of dissolution o fthe non-exposed polymeric material, other solvent or solvents may be selected. The mechanism of polymerization is believed to be due to the initial production of a free nitrilo radical and/or to the reaction of a free radical produced from a free radical yielding substance on exposure to light if a free radical yielding substance is incorporated into the coating. Unpaired electrons formed in the activated compound may then react with an adjacent molecule and unite with it to form either a larger molecule with a free radical or the polymer. The polymerisation process continues in the presence of light until relatively insoluble long, straight or branched, molecular chains comprising covalently-bonded atoms are produced.

The light-sensitivity of the compounds represented by Formula II and derivatives thereof which contain reactive free radicals may be increased by incorporating light-sensitisers into a composition which contains compounds according to the invention. Michler's ketone (4,4'-tetramethyl diaminobenzophenone) is a particularly suitable light-sensitiser. Other suitable light-sensitisers are *p,p*-tetraethyldiaminodiphenylketone; *p,p* - tetramethyldiaminobenzophenone; 1,2-benzanthraquinone; β-chloroanthraquinone; 9,10-anthraquinone; 4-nitro-2-chloro aniline; 2,6-dichloro-4-nitro aniline; 2,4,6-trinitro aniline; 5-nitro-2-amino toluene; and *p*-nitrodiphenyl.

The light-sensitive compounds may be incorporated into the resin either during manufacture of the polymeric compound according to the invention or during the application of the compound to a substrate.

By way of illustration certain preferred processes embodying the invention will now be described in more detail in ensuing specific Examples.

EXAMPLE I 54.8 grams (0.4 mole) of *p*-aminobenzoic acid, 400 ml. of water and 100 ml. concentrated hydrochloric acid were placed in a one-litre three-necked flask equipped with stirrer, dropping funnel and a thermometer. The suspension was stirred and cooled to 0–5° C. and 27.6 grams (0.4 mole) sodium nitrite in 120 ml. water were added in a dropwise manner, keeping the temperature at 0–5° C. On completing this addition the solution was stirred for 10 minutes, then transferred to a two-litre beaker equipped with agitator. 31 grams (0.48 mole) sodium azide dissolved in 100 ml. water were added in a dropwise manner whilst stirring. On completing this addition the bulky precipitate was left standing 30 minutes. The precipitate was filtered off, washed copiously with water and dried at 70° C.; yield: 58 grams *p*-azidobenzoic acid. Melting point 186° C. The following operations were carried out in yellow light:

17 grams (0.5 mole) of an epoxide resin (Araldite MY 790, C.I.B.A. Ltd.) were weighed into a 500 ml. flask. 16.3 grams (0.1 mole) *p*-azidobenzoic acid were added and 150 ml. toluene followed by 2 ml. of benzyl trimethyl ammonium hydroxide. The flask was connected to a reflux condenser and the contents refluxed for 7 hours. On cooling to room temperature the clear toluene solution was decanted from the small amount of residue and bottled.

EXAMPLE II 2 grams of Michler's ketone (4,4'-tetramethyl diaminobenzophenone) were dissolved, in the absence of light, in the solution prepared according to Example I.

EXAMPLE III

The photoresist solutions prepared according to Examples I and II were applied to two series of silicon slices by spinning at 2000 r.p.m. The coated slices were then each exposed through a photomask to ultraviolet light (intensity 4.7 milliwatts per sq. cm.) for 5 minutes and 30 seconds respectively. The photoresist coatings produced according to Examples I and II were subsequently developed by 1 minute's immersion in toluene. The silicon oxide films were then etched in hydrofluoric acid. A resolution of 1.5 micron windows in each case was obtained.

EXAMPLE IV 19 grams of epoxide-novolak resin, available as Bakelite resin ERR 0100, were placed in a 500 ml. flask with 200 ml. of dioxane and stood overnight to dissolve the resin. The following day 16.3 grams of *p*-azidobenzoic acid (prepared as in Example I) and 2 mls. benzyl trimethyl ammonium hydroxide were added. The solution was then refluxed (in a glycerine bath at approximately 130° C.) for 7 hours; allowed to cool to room temperature; and poured into 600 mls. of methanol in a one-litre beaker. A brown resin precipitated and after standing 2 hours to settle the precipitate, the liquid was decanted, leaving the resin at the bottom of the beaker. The resin weighed 28 grams and was dissolved in 270 grams of cyclohexanone. 2.8 grams of Michler's ketone was also dissolved in the cyclohexanone solution. The solution obtained was then applied to the silicon dioxide oxidised surfaces of silicon slices by spinning at 6000 r.p.m. and the coated slices were heated for 20 minutes to 65° C. on a hot plate. Each coated slice was then exposed through a photomask to ultra-violet light (intensity 4.7 milliwatts per sq. cm.) for 5 seconds, and developed by 1 minute's immersion in 1:4 dioxane. The coated slices were then post-stoved at 140° C. in air for 1 hour, then etched in cold hydrofluoric acid. A resolution of 0.6 micron windows was obtained in each case.

What we claim is:

1. A method of producing low molecular weight light-sensitive polymeric compounds comprising reacting, in the presence of a common solvent, *p*-azidobenzoic acid with an epoxide resin of the Formula I:

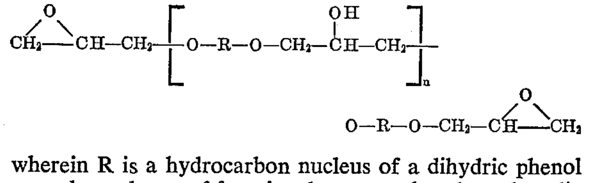

wherein R is a hydrocarbon nucleus of a dihydric phenol or a glycerol gree of functional groups other than phenolic hydroxy groups or a 1,2-propylene oxide derivative thereof and *n* is an integer of 0 to 3.

2. A method according Claim 1, in which the epoxide resin as represented by Formula I has a molecular weight of between 340–1500.

3. A method according to Claim 2, in which the epoxide resin as represented by Formula I has a molecular weight between 340–750.

4. A method according to Claim 3, in which not less than 2 moles of *p*-azidobenzoic acid or an esterifiable derivative thereof are reacted with one mole of the epoxide resin.

5. A method acording to Claim 4, in which the epoxide resin contains two reactive terminal epoxide groups.

6. A method according to Claim 4, in which the epoxide resin is a novolak epoxide resin with molecular weight in the range of 600–750.

7. A method according to Claim 1, in which the epoxide resin is prepared by reacting from 2 to 4 moles of epichlorhydrin with one mole of bisphenol A under an inert atmosphere with the gradual addition of 2 moles of sodium hydroxide, separating the epoxide product and reacting the epoxide with *p*-azidobenzoic acid or an esterifiable derivative thereof at a temperature of less than 150° C.

8. A method according to Claim 6, in which the novolak resin is prepared by reacting one mole of phenol with 0.8 mole formaldehyde in the presence of an acid catalyst at 100° C., separating the product (for example by removing the water) when the desired degree of polymerisation is reached and reacting the novolak resin so produced with epichlorhydrin to form terminal reactive epoxide groups on the novolak resin nucleus, separating the reaction product and reacting the product with *p*-azidobenzoic acid or an esterifiable derivative thereof in the mole ratio of one mole to 3–4 moles of *p*-azidobenzoic acid or the esterifiable derivative thereof.

9. A method according to Claim 1, in which the common solvent is 1,4-dioxane or toluene.

10. Light-sensitive polymeric compounds as represented by the general Formula II

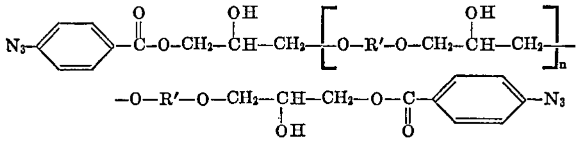

II wherein R′ represents the hydrocarbon nucleus of a dihydric phenol or glycerol which is free from functional groups other than phenolic hydroxy groups or 1,2-propylene oxide, and *n* is an integer between 4 and 3.

11. Light-sensitive polymeric compounds according to Claim 10, in which the compounds contain at least one terminal or cross-linked nitrilo radical, —N=.

12. Light-sensitive polymeric compounds according to Claim 11, in which the hydrocarbon nucleus is *p,p′*-dihydroxydiphenyldimethyl methane.

13. Light-sensitive polymeric compounds according to Claim 12, in which *n* is 0.

14. Light-sensitive polymeric compounds according to Claim 13, in which $R_2$ has a terminal *p*-azidobenzoxy group.

References Cited

UNITED STATES PATENTS

| | | | |
|---|---|---|---|
| 2,852,379 | 9/1958 | Hepher et al. | 260—47 X |
| 3,449,294 | 6/1969 | Danhauser et al. | 260—47 |

WILLIAM H. SHORT, Primary Examiner

T. E. PERTILLA, Assistant Examiner

U.S. Cl. X.R.

96—35.1, 115 R; 117—123 D, 161 ZB; 204—159.14; 260—2 Ep, 30.4 Ep, 33.6 Ep, 59, 469

PO-1050
(5/69)

UNITED STATES PATENT OFFICE
CERTIFICATE OF CORRECTION

Patent No. 3,822,235 (PHB 32,141) Dated July 2,1974

Inventor(s) DONALD NOEL HUNTER ET AL

It is certified that error appears in the above-identified patent and that said Letters Patent are hereby corrected as shown below:

Column 6, line 63, "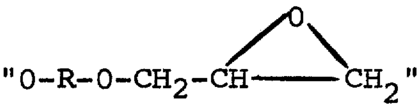" should be

-- 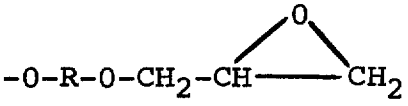 --.

Signed and sealed this 1st day of October 1974.

(SEAL)
Attest:

McCOY M. GIBSON JR.
Attesting Officer

C. MARSHALL DANN
Commissioner of Patents